(12) United States Patent
Choi et al.

(10) Patent No.: US 10,825,833 B1
(45) Date of Patent: Nov. 3, 2020

(54) SEMICONDUCTOR DEVICE INCLUDING PARTIALLY ENLARGED CHANNEL HOLE

(71) Applicant: Samsung Electronics Co., Ltd., Suwon-si (KR)

(72) Inventors: Eunyeoung Choi, Hwaseong-si (KR); Hyung Joon Kim, Hwaseong-si (KR); Bio Kim, Hwaseong-si (KR); Yujin Kim, Hwaseong-si (KR); Junggeun Jee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/930,711

(22) Filed: Jul. 16, 2020

Related U.S. Application Data

(63) Continuation of application No. 16/203,790, filed on Nov. 29, 2018, now Pat. No. 10,756,107.

(30) Foreign Application Priority Data

Jul. 12, 2018 (KR) .......................... 10-2018-0081134

(51) Int. Cl.
*H01L 27/11582* (2017.01)
*H01L 27/1157* (2017.01)
*H01L 23/532* (2006.01)

(52) U.S. Cl.
CPC .. *H01L 27/11582* (2013.01); *H01L 23/53295* (2013.01); *H01L 27/1157* (2013.01)

(58) Field of Classification Search
None
See application file for complete search history.

(56) References Cited

U.S. PATENT DOCUMENTS

| | | | |
|---|---|---|---|
| 9,000,508 B2 | 4/2015 | Lee et al. | |
| 9,853,043 B2 | 12/2017 | Lu et al. | |
| 9,871,052 B2 | 1/2018 | Lee | |
| 2010/0038699 A1* | 2/2010 | Katsumata | ............ H01L 29/792 257/324 |
| 2017/0345843 A1 | 11/2017 | Lee et al. | |
| 2017/0352552 A1 | 12/2017 | Lee | |
| 2018/0090369 A1 | 3/2018 | Sasaki | |

(Continued)

FOREIGN PATENT DOCUMENTS

| | | |
|---|---|---|
| KR | 20150138139 A | 12/2015 |
| KR | 20170134039 A | 12/2017 |

*Primary Examiner* — Sitaramarao S Yechuri
(74) *Attorney, Agent, or Firm* — Harness, Dickey & Pierce, P.L.C.

(57) ABSTRACT

A semiconductor device includes a lower stack structure on a substrate, an upper stack structure on the lower stack structure, and a channel structure in a channel hole formed through the upper stack structure and the lower stack structure. The channel hole includes a lower channel hole in the lower stack structure, an upper channel hole in the upper stack structure, and a partial extension portion adjacent to an interface between the lower stack structure and the upper stack structure. The partial extension portion is in fluid communication with the lower channel hole and the upper channel hole. A lateral width of the partial extension portion may be greater than a lateral width of the upper channel hole adjacent to the partial extension portion and greater than a lateral width of the upper channel hole adjacent to the partial extension portion.

18 Claims, 14 Drawing Sheets

(56) References Cited

U.S. PATENT DOCUMENTS

| | | | |
|---|---|---|---|
| 2019/0081060 A1* | 3/2019 | Lu | H01L 27/11582 |
| 2019/0189218 A1* | 6/2019 | Izumi | G11C 16/10 |
| 2019/0198521 A1* | 6/2019 | Komiya | H01L 23/528 |
| 2019/0198522 A1* | 6/2019 | Takekida | H01L 27/1157 |
| 2019/0279997 A1* | 9/2019 | Nishimori | H01L 27/0688 |

* cited by examiner

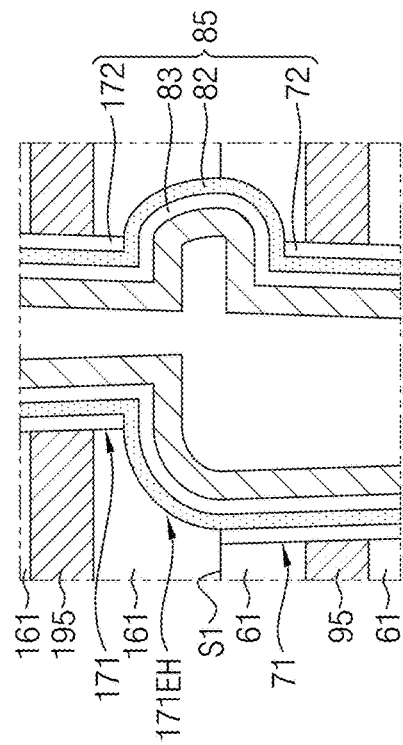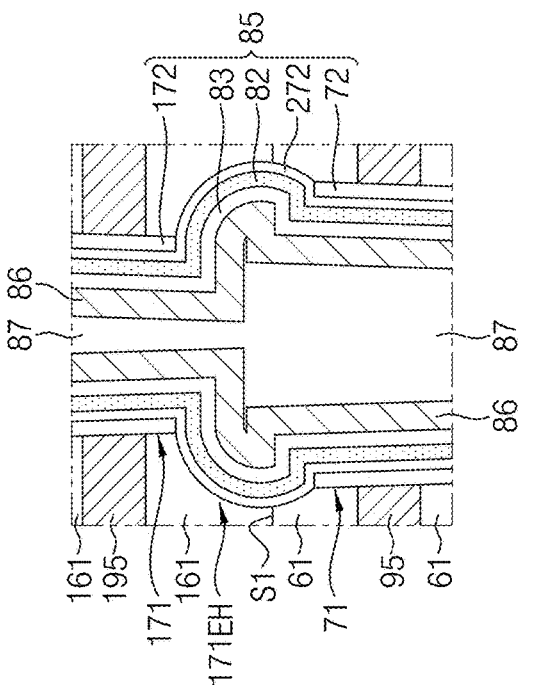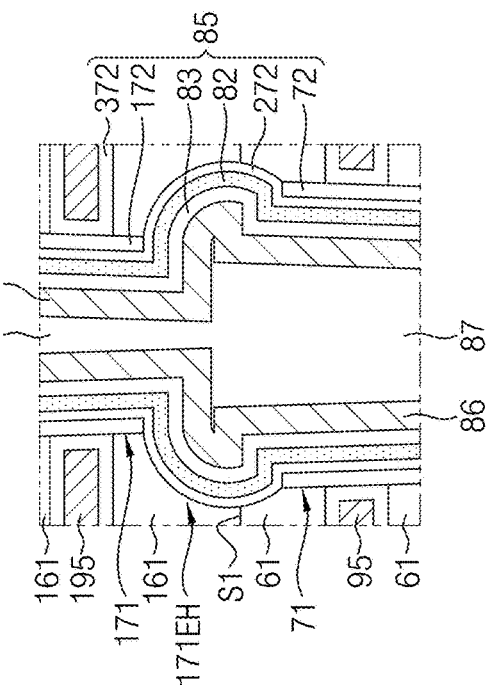

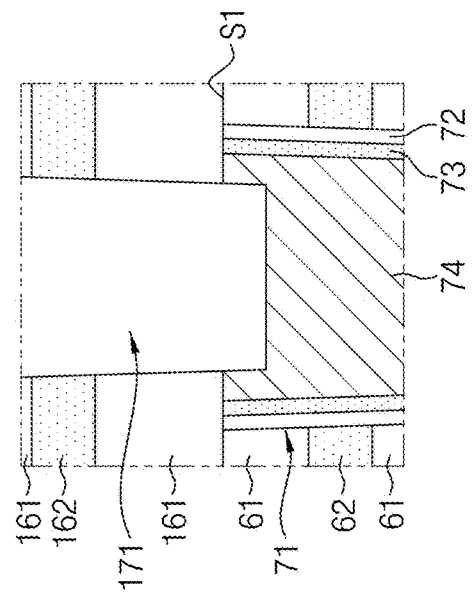
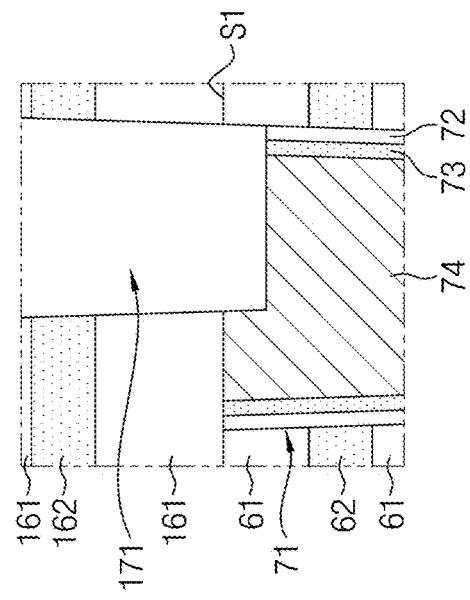
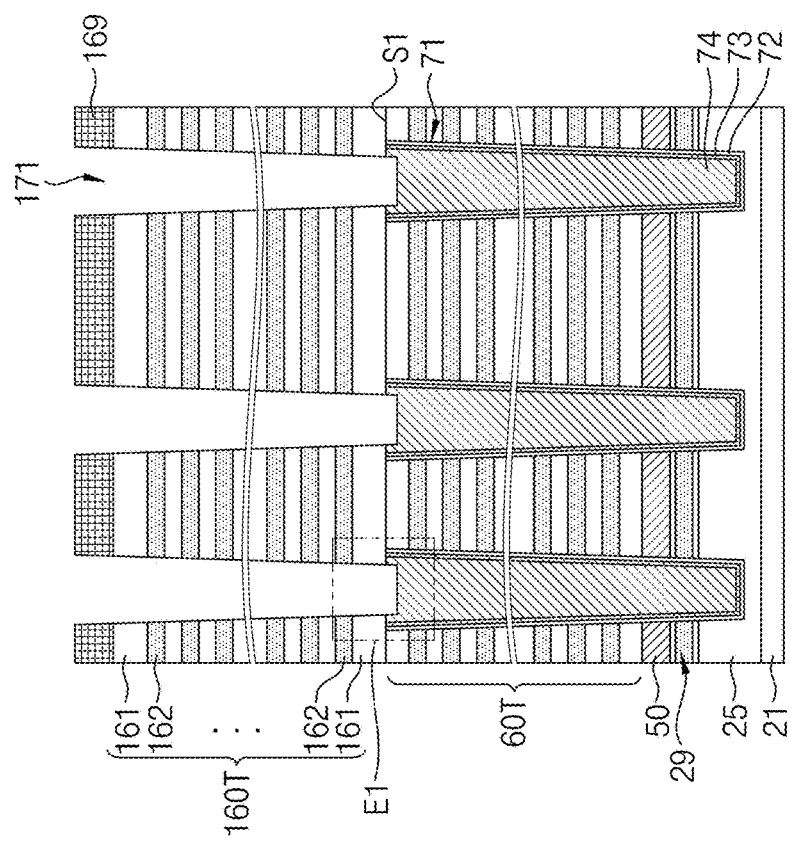

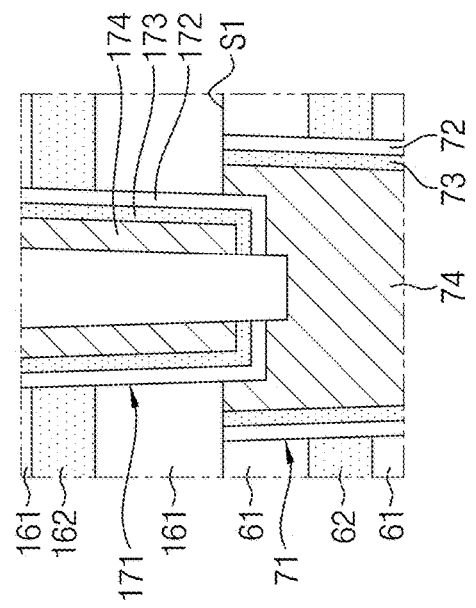
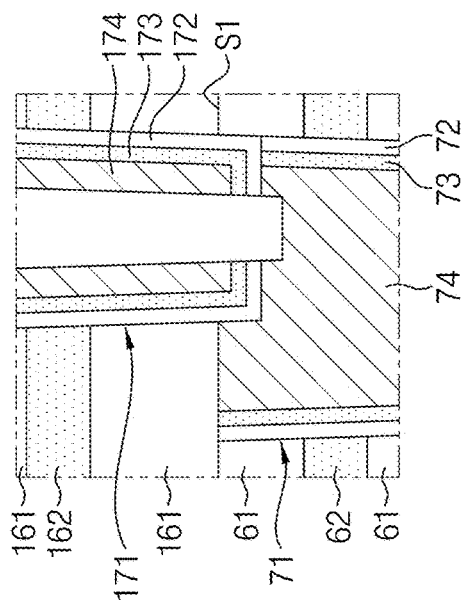
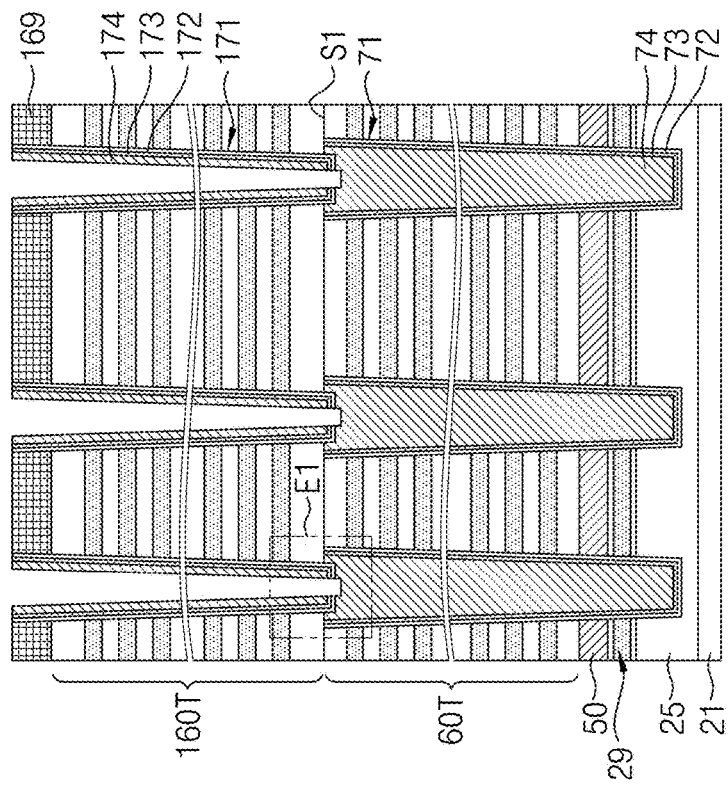

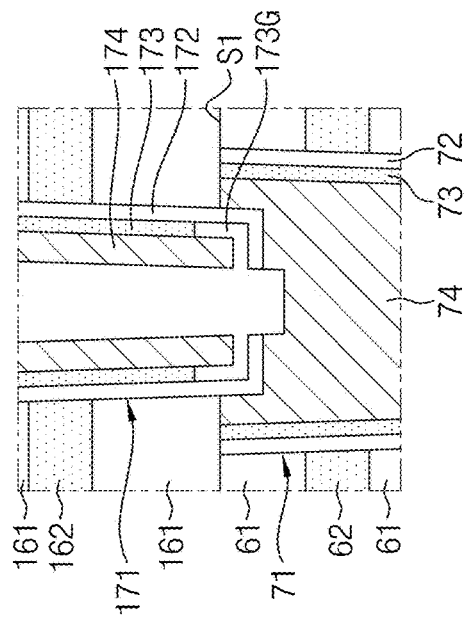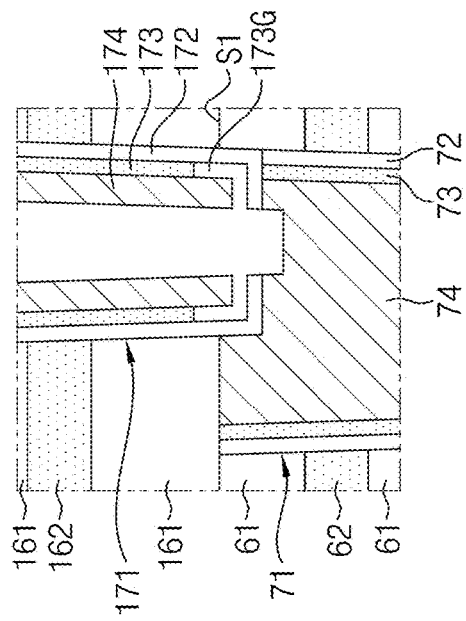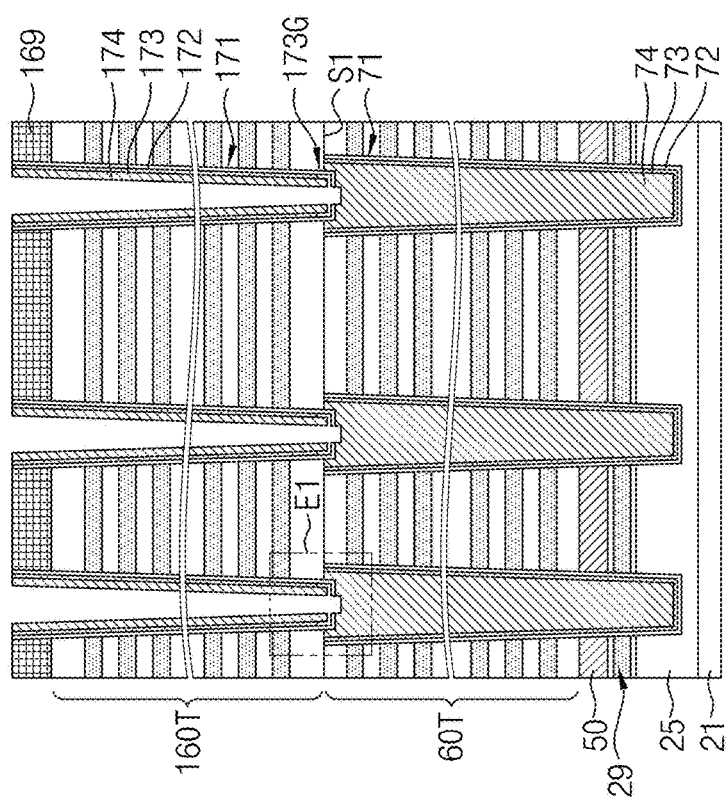

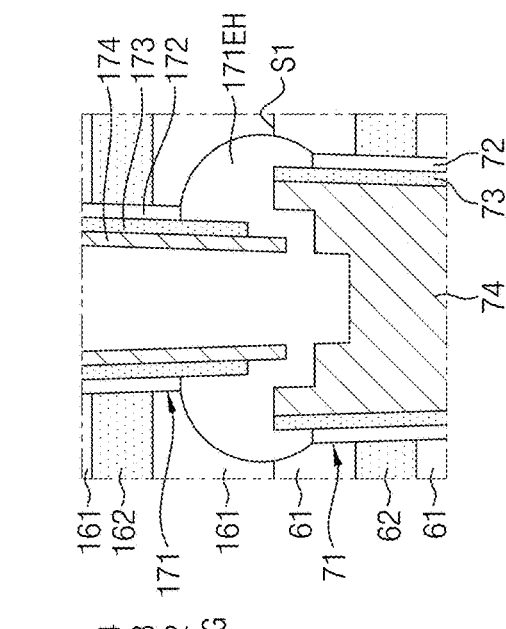
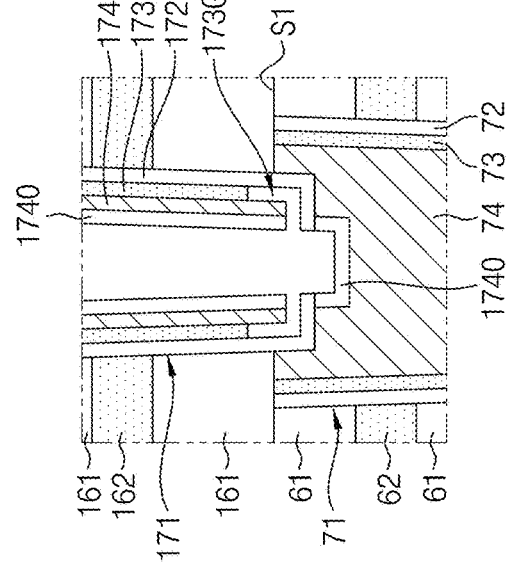
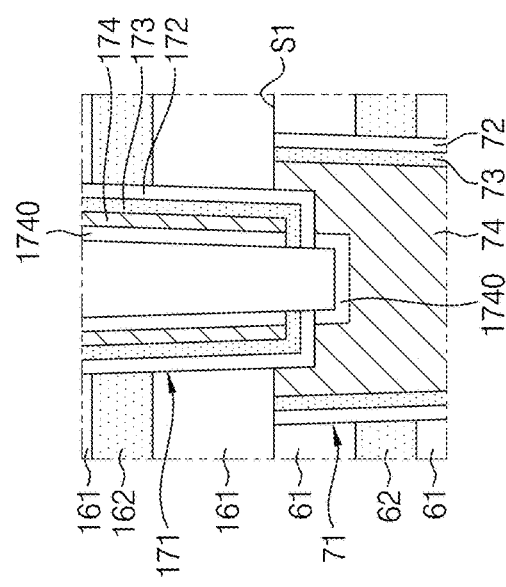

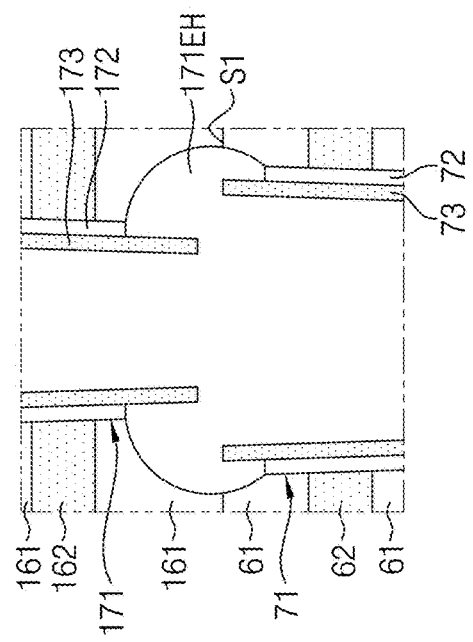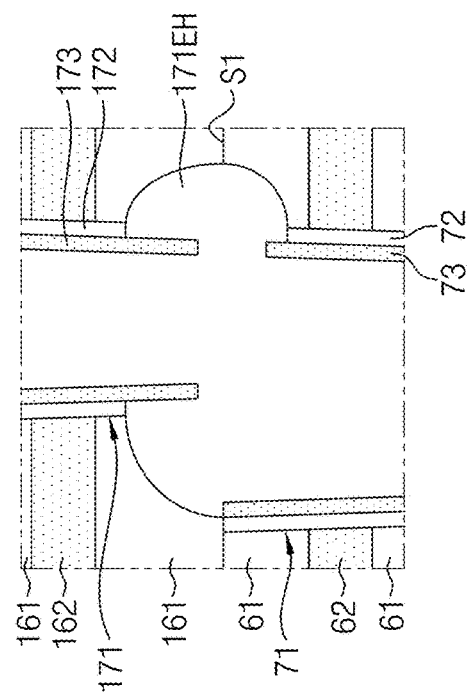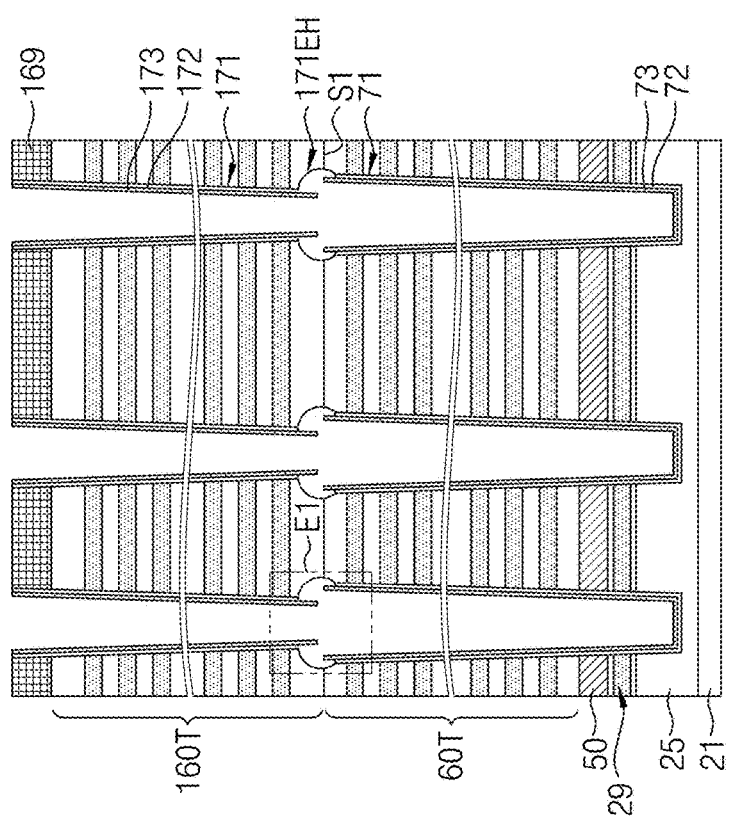

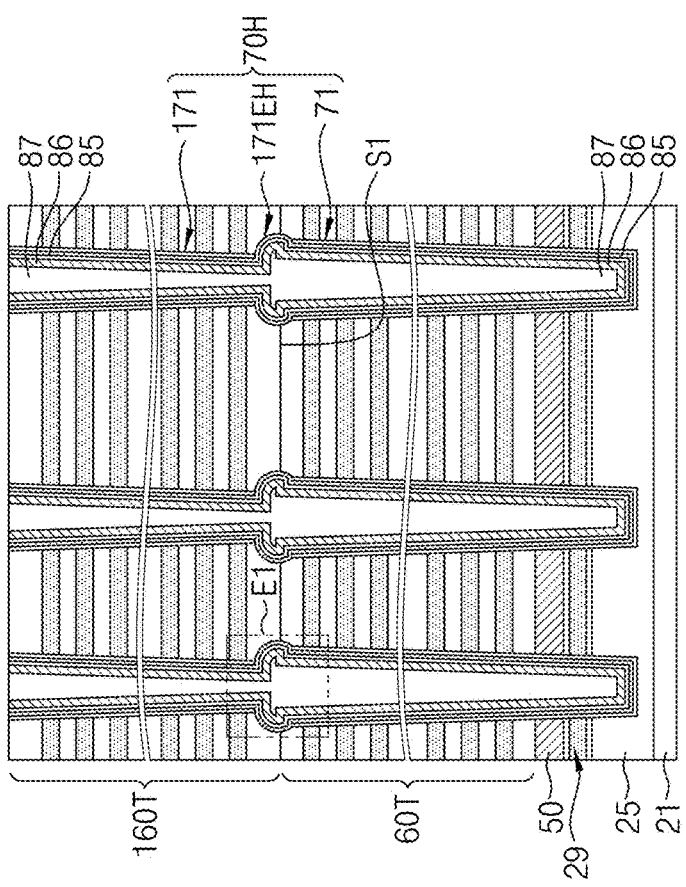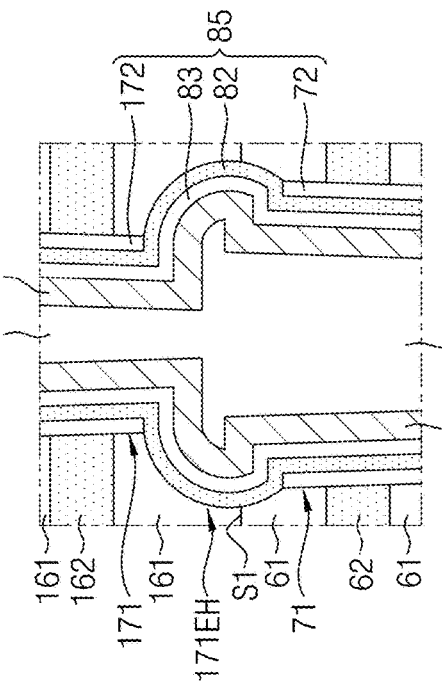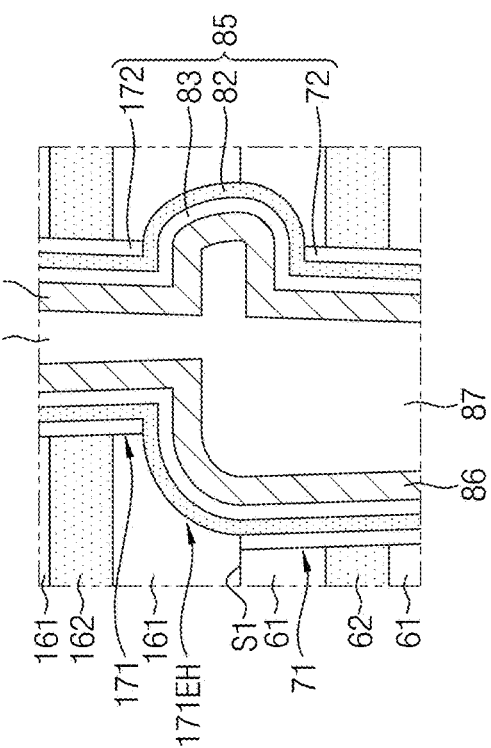

SEMICONDUCTOR DEVICE INCLUDING PARTIALLY ENLARGED CHANNEL HOLE

CROSS-REFERENCE TO RELATED APPLICATION

This U.S. non-provisional patent application is a continuation of U.S. application Ser. No. 16/203,790, filed Nov. 29, 2018, which claims priority under 35 U.S.C. § 119 to and the benefit of Korean Patent Application No. 10-2018-0081134, filed on Jul. 12, 2018, in the Korean Intellectual Property Office (KIPO), the disclosure of each of which is incorporated herein by reference in its entirety.

BACKGROUND

1. Field

Devices and methods consistent with example embodiments relate to a multi-stack semiconductor device having a partially of enlarged channel holes and a method of forming the multi-stack semiconductor device.

2. Description of Related Art

Since semiconductor devices with greater integration density are being developed, research has been conducted into a technique of using a stack structure including a plurality of insulating layers and a plurality of conductive layers that are alternately stacked. A channel pattern may be formed through the stack structure. A height of the stack structure is gradually on the increase, and it is becoming increasingly difficult to uniformly and continuously form the channel pattern.

SUMMARY

Example embodiments of inventive concepts are directed to providing a semiconductor device having excellent electrical properties and a method of forming the semiconductor device.

According to some example embodiments, a semiconductor device may include a substrate, a lower stack structure on the substrate, an upper stack structure on the lower stack structure, and a channel structure. The lower stack structure may include a plurality of lower insulating layers and a plurality of lower conductive layers that are alternately stacked on the substrate. The upper stack structure may include a plurality of upper insulating layers and a plurality of upper conductive layers that are alternately stacked on the lower stack structure. The upper stack structure and the lower stack structure may define a channel hole that extends through the upper stack structure and the lower stack structure. The channel hole may include a lower channel hole defined by the lower stack structure, an upper channel hole defined by the upper stack structure, and a partial extension portion adjacent to an interface between the lower stack structure and the upper stack structure. The partial extension portion may be a portion of the channel hole defined by an uppermost lower insulating layer and a lowermost upper insulating layer among the plurality of lower insulating layers and the plurality of upper insulating layers. The partial extension portion may be in fluid communication with the lower channel hole and the upper channel hole. A lateral width of the partial extension portion may be greater than a lateral width of the upper channel hole at a region adjacent to the partial extension portion. The lateral width of the partial extension portion may be greater than a lateral width of the lower channel hole at the region adjacent to the partial extension portion. The channel structure may be in the channel hole.

According to some example embodiments, a semiconductor device may include a substrate, a lower stack structure on the substrate, an upper stack structure on the lower stack structure, and a channel structure. The lower stack structure may include a plurality of lower insulating layers and a plurality of lower conductive layers that are alternately stacked on the substrate. The upper stack structure may include a plurality of upper insulating layers and a plurality of upper conductive layers that are alternately stacked on the lower stack structure. The upper stack structure and the lower stack structure may define a channel hole that extends through the upper stack structure and the lower stack structure. The channel structure may be in the channel hole. The channel structure may include a channel pattern, a tunnel insulating layer surrounding an outside if the channel pattern, a charge storage layer surrounding an outside of the tunnel insulating layer, a lower blocking layer between the charge storage layer the lower stack structure, and upper blocking layer between the charge storage layer and the upper stack structure. The upper blocking layer may be spaced apart from the lower blocking layer.

According to some example embodiments, a semiconductor device may include a substrate, a lower stack structure on the substrate, an upper stack structure on the lower stack structure, and a channel structure. The lower stack structure may include a plurality of lower insulating layers and a plurality of lower conductive layers that are alternately stacked on the substrate. The upper stack structure may include a plurality of upper insulating layers and a plurality of upper conductive layers that are alternately stacked on the lower stack structure. The upper stack structure and the lower stack structure may define a channel hole that extends through the upper stack structure and the lower stack structure. The channel hole may include a lower channel hole defined by the lower stack structure, an upper channel hole defined by the upper stack structure, and a partial extension portion adjacent to an interface between the lower stack structure and the upper stack structure. The partial extension portion may be a portion of the channel hole defined by an uppermost lower insulating layer and a lowermost upper insulating layer among the plurality of lower insulating layers and the plurality of upper insulating layers. The partial extension portion may be in fluid communication with the lower channel hole and the upper channel hole. A lateral width of the partial extension portion may be greater than a lateral width of the upper channel hole at a region adjacent to the partial extension portion. The lateral width of the partial extension portion may be greater than a lateral width of the lower channel hole at the region adjacent to the partial extension portion. The channel structure may be in the channel hole. The channel structure includes a channel pattern, a tunnel insulating layer surrounding an outside of the channel pattern, a charge storage layer surrounding an outside of the tunnel insulating layer, and an inner blocking layer surrounding an outside of the charge storage layer.

BRIEF DESCRIPTION OF THE DRAWINGS

FIGS. 4 to 6 are detailed enlarged partial views of a portion of a semiconductor device according to example embodiments.

FIGS. 8 to 10, 13, 16, 19, 22, 28, 31, 34, and 39 are cross-sectional views taken along line I-I' of FIG. 3, illustrating a method of forming a semiconductor device according to an example embodiment.

FIGS. 11, 12, 14, 15, 17, 18, 20, 21, 23 to 27, 29, 30, 32, 33, and 35 to 38 are enlarged partial views illustrating a method of forming a semiconductor device according to an example embodiment.

DETAILED DESCRIPTION

Figure 2:
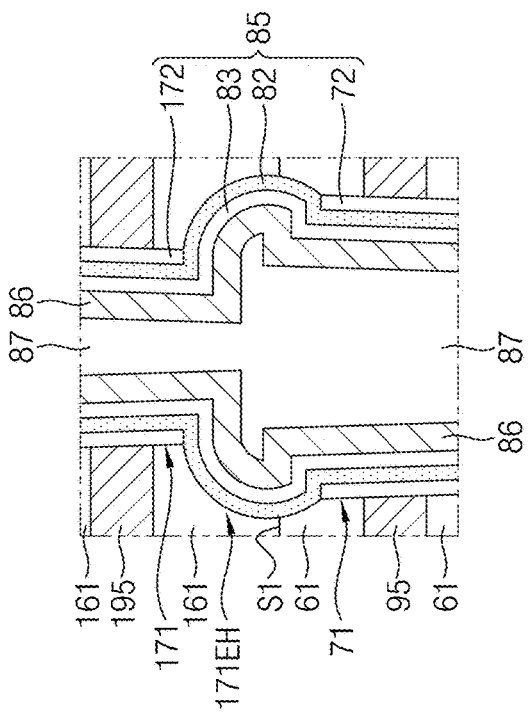
FIG. 2 is a detailed enlarged partial view of a portion of FIG. 1.
Figure 3:
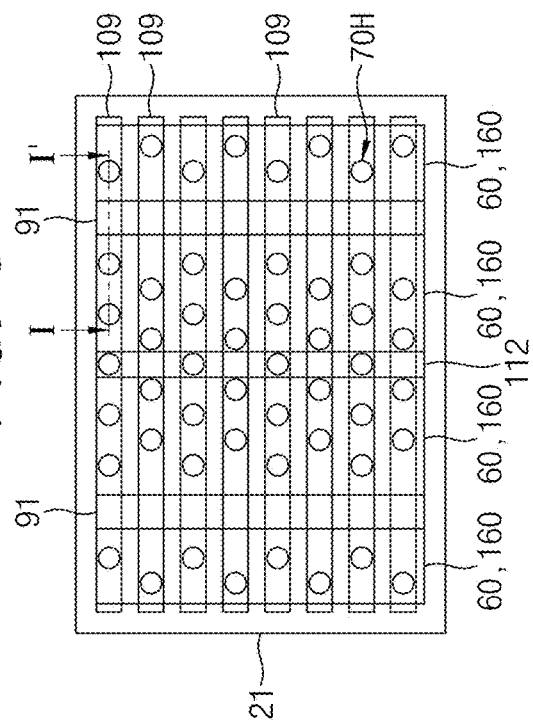
FIG. 3 is a layout illustrating main components of the semiconductor device according to an example embodiment.
Figure 1:
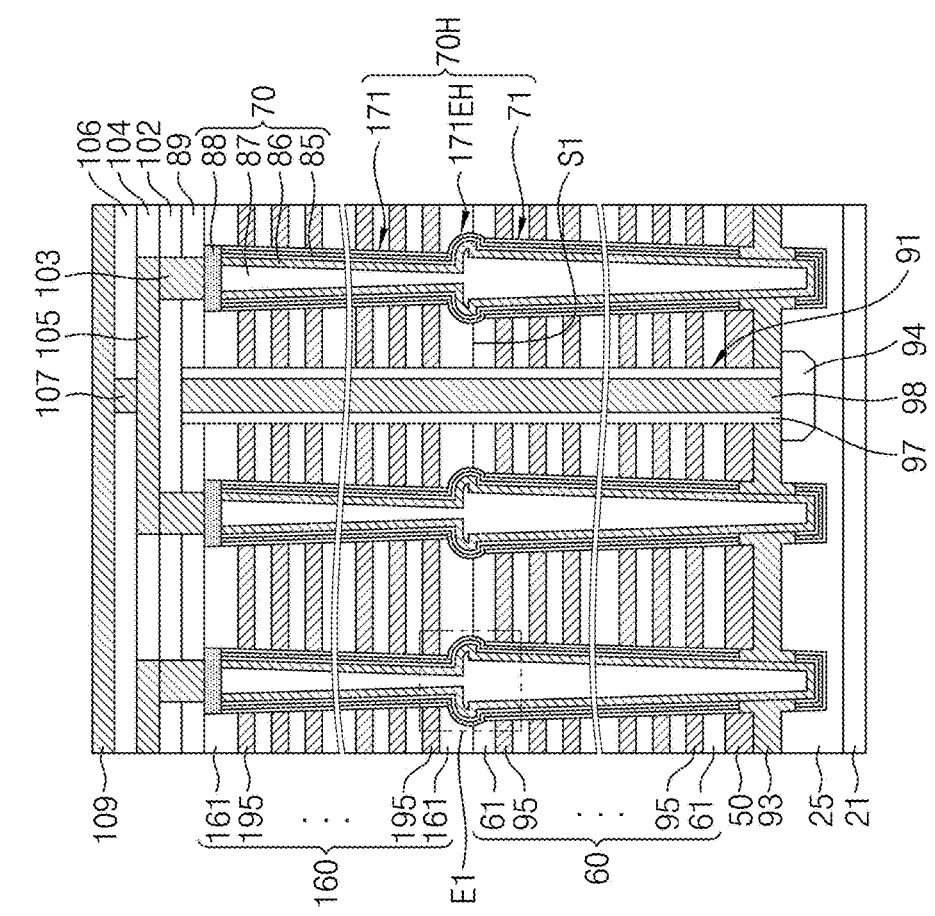
FIG. 1 is a cross-sectional view illustrating a semiconductor device according to an example embodiment.

FIG. 1 is a cross-sectional view illustrating a semiconductor device according to an example embodiment. FIG. 2 is a detailed enlarged partial view of a portion E1 of FIG. 1. FIG. 3 is a layout illustrating main components of the semiconductor device. FIG. 1 is a cross-sectional view taken along line I-I' of FIG. 3. A semiconductor device according to an example embodiment may include a non-volatile memory, such as a vertical NAND (VNAND) device or a three-dimensional (3D) flash memory.

Referring to FIG. 1, the semiconductor device according to the example embodiment may include a substrate 21, a buried conductive layer 25, a replacement conductive line 93, a support 50, a lower stack structure 60, an upper stack structure 160, a plurality of channel holes 70H, a plurality of channel structures 70, a first interlayer insulating layer 89, an isolation trench 91, an impurity region 94, insulating spacers 97, a trench buried layer 98, a second interlayer insulating layer 102, a plurality of sub-bit plugs 103, a third interlayer insulating layer 104, a plurality of sub-bit lines 105, a fourth interlayer insulating layer 106, a bit plug 107, and a bit line 109.

The lower stack structure 60 may include a plurality of lower insulating layers 61 and a plurality of lower conductive layers 95, which are stacked alternately and repetitively. The upper stack structure 160 may include a plurality of upper insulating layers 161 and a plurality of upper conductive layers 195, which are stacked alternately and repetitively. A lowermost layer of the plurality of lower conductive layers 95 may correspond to a ground selection line GSL or a source selection line SSL. An uppermost layer of the plurality of upper conductive layers 195 may correspond to a string selection line SSL or a drain selection line DSL. Some of the plurality of lower conductive layers 95 and the plurality of upper conductive layers 195 may correspond to word lines. The isolation trench 91 may correspond to a word line cut. The replacement conductive line 93 may correspond to a common source line CSL.

Each of the plurality of channel holes 70H may be formed through (e.g., defined by) the upper stack structure 160, the lower stack structure 60, the support 50, and the replacement conductive line 93. Each of the plurality of channel holes 70H may include a lower channel hole 71, an upper channel hole 171, and a partial extension portion 171EH. The lower channel hole 71 may be disposed in the lower stack structure 60. The upper channel hole 171 may be disposed in the upper stack structure 160. The partial extension portion 171EH may be adjacent to an interface S1 between the lower stack structure 60 and the upper stack structure 160 and communicate with the lower channel hole 71 and the upper channel hole 171. The partial extension portion 171EH may be a portion of the channel hole 70H defined by an uppermost lower insulating layer and a lowermost upper insulating layer among the plurality of lower insulating layers 61 and the plurality of upper insulating layers 161.

Each of the plurality of channel structures 70 may include an information storage pattern 85, a channel pattern 86, a core pattern 87, and a pad 88. The information storage pattern 85 may include a lower blocking layer 72, an upper blocking layer 172, a charge storage layer 82, and a tunnel insulating layer 83. The plurality of channel structures 70 may be disposed inside the plurality of channel holes 70H.

Referring to FIG. 2, a lateral width of the partial extension portion 171EH may be greater than a lateral width of the upper channel hole 171 adjacent to the partial extension portion 171EH. The lateral width of the partial extension portion 171EH may be greater than a lateral width of the lower channel hole 71 adjacent to the partial extension portion 171EH.

An uppermost end of the partial extension portion 171EH may be at a higher level than the interface S1 between the lower stack structure 60 and the upper stack structure 160. A lowermost end of the partial extension portion 171EH may be at a lower level than the interface S1. The channel pattern 86 may surround the outside of the core pattern 87. The tunnel insulating layer 83 may surround the outside of the channel pattern 86. The charge storage layer 82 may surround the outside of the tunnel insulating layer 83. The lower blocking layer 72 may be disposed between the charge storage layer 82 and the lower stack structure 60. The upper blocking layer 172 may be disposed between the charge storage layer 82 and the upper stack structure 160.

The upper blocking layer 172 may be spaced to be apart from the lower blocking layer 72. A lowermost end of the upper blocking layer 172 may be at a higher level than the interface S1. The lowermost end of the upper blocking layer 172 may be at a lower level than a lowermost layer of the plurality of upper conductive layers 195. An uppermost end of the lower blocking layer 72 may be at a lower level than the interface S1. The uppermost end of the lower blocking layer 72 may be at a higher level than an uppermost layer of the plurality of lower conductive layers 95. The charge storage layer 82 may be in direct contact with a lowermost layer of the plurality of upper insulating layers 161 between the upper blocking layer 172 and the lower blocking layer 72. The charge storage layer 82 may be in direct contact with an uppermost layer of the plurality of lower insulating layers 61 between the upper blocking layer 172 and the lower blocking layer 72.

The charge storage layer 82 in the partial extension portion 171EH may be in direct contact with the lowermost layer of the plurality of upper insulating layers 161. The charge storage layer 82 in the partial extension portion 171EH may be in direct contact with the uppermost layer of the plurality of lower insulating layers 61. The charge storage layer 82 in the partial extension portion 171EH may be in direct contact with the interface S1.

Referring to FIG. 3, stack structures 60 and 160, a plurality of channel holes 70H, a plurality of isolation trenches 91, a plurality of bit lines 109, and a selection line isolation pattern 112 may be disposed on a substrate 21. The stack structure 60 and 160 may include a lower stack structure 60 and an upper stack structure 160.

FIGS. 4 to 6 are detailed enlarged partial views of a portion of a semiconductor device according to example embodiments.

Referring to FIG. 4, an information storage pattern 85 may include a lower blocking layer 72, an upper blocking layer 172, an inner blocking layer 272, a charge storage layer 82, and a tunnel insulating layer 83.

The inner blocking layer 272 may surround the outside of the charge storage layer 82. The inner blocking layer 272 may be disposed between the charge storage layer 82 and the lower stack structure 60 and between the charge storage layer 82 and the upper stack structure 160. The inner blocking layer 272 may be in direct contact with a lowermost layer of the plurality of upper insulating layers 161 between the upper blocking layer 172 and the lower blocking layer 72. The inner blocking layer 272 may be disposed between the lowermost layer of the plurality of upper insulating layers 161 and the charge storage layer 82. The inner blocking layer 272 may be in direct contact with an uppermost layer of the plurality of lower insulating layers 61 between the upper blocking layer 172 and the lower blocking layer 72. The inner blocking layer 272 may be disposed between the uppermost layer of the plurality of lower insulating layers 61 and the charge storage layer 82.

Referring to FIG. 5, an information storage pattern 85 may include a lower blocking layer 72, an upper blocking layer 172, an inner blocking layer 272, an outer blocking layer 372, a charge storage layer 82, and a tunnel insulating layer 83.

The outer blocking layer 372 may cover top surfaces, bottom surfaces, and side surfaces of a plurality of lower conductive layers 95 and a plurality of upper conductive layers 195. The outer blocking layer 372 may be disposed between the lower blocking layer 72 and the plurality of lower conductive layers 95 and between the upper blocking layer 172 and the plurality of upper conductive layers 195. The outer blocking layer 372 may include silicon oxide, silicon nitride, silicon oxynitride, a high-k dielectric material, or a combination thereof. The outer blocking layer 372 may include the same material as the inner blocking layer 272, the upper blocking layer 172, and the lower blocking layer 72. For example, the outer blocking layer 372, the inner blocking layer 272, the upper blocking layer 172, and the lower blocking layer 72 may include silicon oxide.

In an embodiment, the outer blocking layer 372 may be omitted. In an embodiment, the upper blocking layer 172 and the lower blocking layer 72 may be omitted.

Referring to FIG. 6, a center of an upper channel hole 171 may be disposed to deviate from a center of a lower channel hole 71. An uppermost end of the lower blocking layer 72 may be at substantially the same level as the interface S1. At least a portion of a top surface of the lower blocking layer 72 may be at a lower level than the interface S1.

Figure 7:
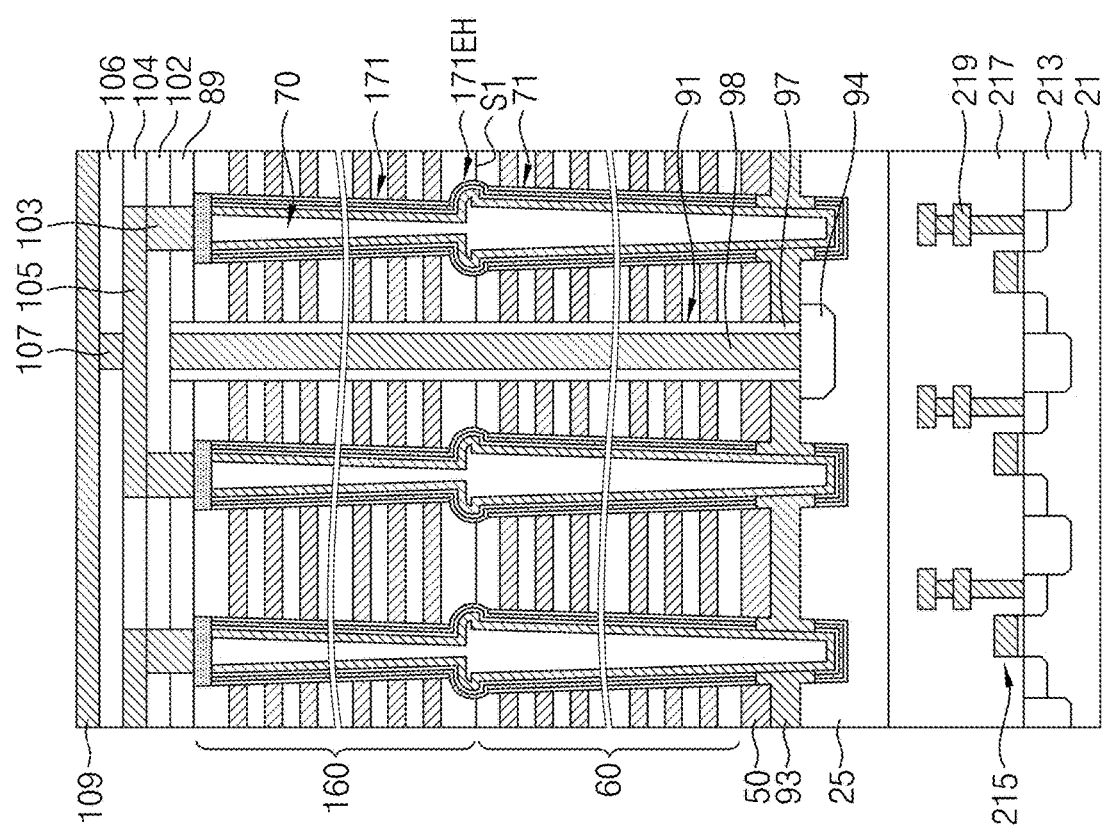
FIG. 7 is a cross-sectional view illustrating a semiconductor device according to an example embodiment.

FIG. 7 is a cross-sectional view illustrating a semiconductor device according to an example embodiment.

Referring to FIG. 7, the semiconductor device according to the example embodiment may include a substrate 21, a device isolation layer 213, a plurality of transistors 215, a lower interlayer insulating layer 217, a peripheral circuit interconnecting wire 219, a buried conductive layer 25, a replacement conductive line 93, a support 50, a lower stack structure 60, an upper stack structure 160, a plurality of lower channel holes 71, a plurality of upper channel holes 171, a partial extension portion 171EH, a plurality of channel structures 70, a first interlayer insulating layer 89, an isolation trench 91, an impurity region 94, insulating spacers 97, a trench buried layer 98, a second interlayer insulating layer 102, a plurality of sub-bit plugs 103, a third interlayer insulating layer 104, a plurality of sub-bit lines 105, a fourth interlayer insulating layer 106, a bit plug 107, and a bit line 109. The semiconductor device according to the example embodiment may be interpreted as including a cell-on-peripheral (COP) structure.

In an embodiment, the device isolation layer 213 may include silicon oxide, silicon nitride, silicon oxynitride, a low-k dielectric material, or a combination thereof. The plurality of transistors 215 may include a fin field-effect transistor (finFET), a multi-bridge channel (MBC) transistor, a nanowire transistor, a vertical transistor, a recess-channel transistor, three-dimensional (3D) transistor, a planar transistor, or a combination thereof. The lower interlayer insulating layer 217 may include silicon oxide, silicon nitride, silicon oxynitride, a low-k dielectric material, or a combination thereof. The peripheral circuit interconnecting wire 219 may include a metal, a metal nitride, a metal silicide, polysilicon (poly-Si), conductive carbon, or a combination thereof. The lower conductive layer 25 may include a plurality of semiconductor layers having different conductivity types, a metal layer, a metal nitride layer, a metal silicide layer, a conductive carbon layer, or a combination thereof. The plurality of transistors 215 and the peripheral circuit interconnecting wire 219 may constitute a peripheral circuit in various combinations.

FIGS. 8 to 10, 13, 16, 19, 22, 28, 31, 34, and 39 are cross-sectional views taken along line I-I' of FIG. 3, illustrating a method of forming a semiconductor device according to an example embodiment. FIGS. 11, 12, 14, 15, 17, 18, 20, 21, 23 to 27, 29, 30, 32, 33, and 35 to 38 are enlarged partial views illustrating a method of forming the semiconductor device.

Figure 8:
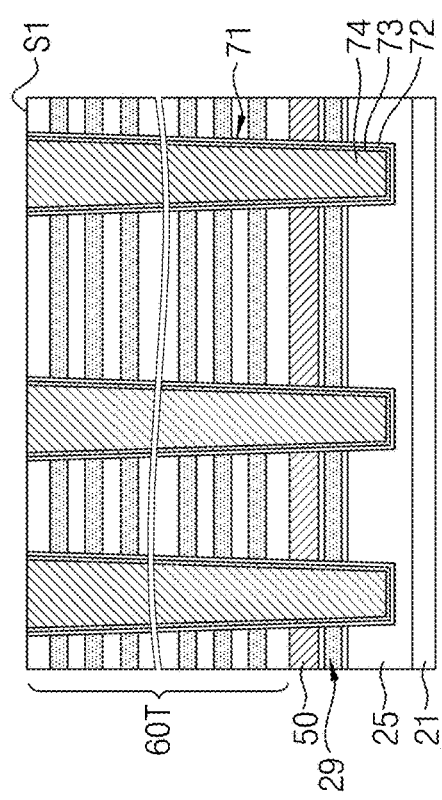

Referring to FIGS. 3 and 8, a buried conductive layer 25 may be defined in a desired (and/or alternatively predetermined) region of a substrate 21. A mold layer 29 may be formed on the buried conductive layer 25. The mold layer 29 may include a lower mold layer 29A, a middle mold layer 29M, and an upper mold layer 29C, which are sequentially stacked. A support 50 may be formed on the mold layer 29. A preliminary lower stack structure 60T may be formed on the support 50 by alternately and repetitively stacking a plurality of lower insulating layers 61 and a plurality of lower sacrificial layers 62.

The substrate 21 may include a semiconductor substrate, such as a silicon wafer or a silicon on insulator (SOI) wafer. For example, the substrate 21 may be a P-type single-crystalline silicon wafer. The buried conductive layer 25 may be formed to have a desired (and/or alternatively predetermined) depth from a surface of the substrate 21. The buried conductive layer 25 may be a P type or an N type. For instance, the buried conductive layer 25 may include N-type single-crystalline silicon. In an embodiment, the buried conductive layer 25 may include a semiconductor layer, such as poly-Si. The buried conductive layer 25 may be omitted.

The mold layer 29 may include an oxide, a nitride, a semiconductor, or a combination thereof. The mold layer 29 may include a material having an etch selectivity with respect to the buried conductive layer 25. The middle mold layer 29M may include a material having an etch selectivity with respect to the buried conductive layer 25), the lower mold layer 29A, and the upper mold layer 29C. For example, the lower mold layer 29A may include silicon oxide, the middle mold layer 29M may include silicon nitride, and the upper mold layer 29C may include silicon oxide. A thickness of the middle mold layer 29M may be greater than that of the lower mold layer 29A or that of the upper mold layer 29C. The support 50 may cover the mold layer 29. The support 50 may include a material having an etch selectivity with respect to the mold layer 29. For example, the support 50 may include poly-Si.

The plurality of lower insulating layers 61 may include an insulating material, such as silicon oxide, silicon nitride, silicon oxynitride, or a combination thereof. The plurality of lower sacrificial layers 62 may include a material having an etch selectivity with respect to the plurality of lower insulating layers 61. For example, the plurality of lower insulating layers 61 may include an oxide, such as silicon oxide, and the plurality of lower sacrificial layers 62 may include a nitride, such as silicon nitride. A lowermost layer of the preliminary lower stack structure 60T may be a lowermost layer of the plurality of lower insulating layers 61, and an uppermost layer of the preliminary lower stack structure 60T may be an uppermost layer of the plurality of lower insulating layers 61.

Figure 9:
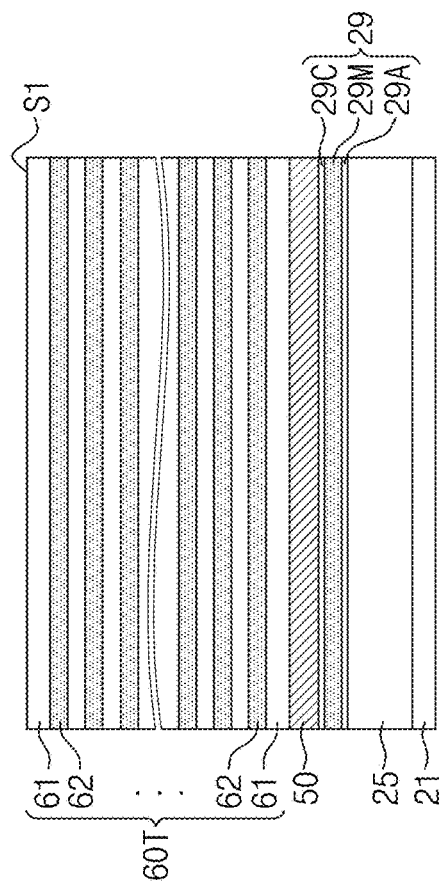

Referring to FIGS. 3 and 9, a plurality of lower channel holes 71 may be formed through the preliminary lower stack structure 60T, the support 50, and the mold layer 29 using a patterning process. Each of the plurality of lower channel holes 71 may be completely formed through the preliminary lower stack structure 60T, the support 50, and the mold layer 29 and penetrate into the buried conductive layer 25. A lower blocking layer 72, a lower sacrificial liner 73, and a lower sacrificial buried layer 74 may be formed inside the plurality of lower channel holes 71.

The lower blocking layer 72 may include silicon oxide, silicon nitride, silicon oxynitride, a high-k dielectric material, or a combination thereof. For example, the lower blocking layer 72 may include silicon oxide. The lower sacrificial liner 73 may include a material having an etch selectivity with respect to the lower blocking layer 72 and the lower sacrificial buried layer 74. The lower sacrificial liner 73 may include silicon oxide, silicon nitride, silicon oxynitride, a high-k dielectric material, or a combination thereof. For example, the lower sacrificial liner 73 may include silicon nitride. The lower sacrificial buried layer 74 may include a material having an etch selectivity with respect to the lower sacrificial liner 73. The lower sacrificial buried layer 74 may include poly-Si, silicon oxide, silicon nitride, silicon oxynitride, or a combination thereof. For instance, the lower sacrificial buried layer 74 may include poly-Si.

The formation of the lower blocking layer 72, the lower sacrificial liner 73, and the lower sacrificial buried layer 74 may include a plurality of thin-film forming processes and a plurality of planarization processes. The plurality of planarization processes may include a chemical mechanical polishing (CMP) process, an etchback process, or a combination thereof. The lower sacrificial liner 73 may surround side surfaces and a bottom surface of the lower sacrificial buried layer 74. The lower blocking layer 72 may surround outer side surfaces and a bottom surface of the lower sacrificial liner 73. The lower blocking layer 72 may be in direct contact with inner walls of the plurality of lower channel holes 71. The lower blocking layer 72 may be in direct contact with the plurality of lower insulating layers 61, the plurality of lower sacrificial layers 62, the support 50, the mold layer 29, and the buried conductive layer 25.

Referring to FIGS. 3 and 10, a preliminary upper stack structure 160T may be formed by alternately and repetitively stacking a plurality of upper insulating layers 161 and a plurality of upper sacrificial layers 162 on the preliminary lower stack structure 60T. An interface S1 may be formed between the preliminary lower stack structure 60T and the preliminary upper stack structure 160T. A mask pattern 169 may be formed on the preliminary upper stack structure 160T. A plurality of upper channel holes 171 may be formed through the preliminary upper stack structure 160T using a patterning process.

The plurality of upper insulating layers 161 may include an insulating material, such as silicon oxide, silicon nitride, silicon oxynitride, or a combination thereof. The plurality of upper insulating layers 161 may include substantially the same material as the plurality of lower insulating layers 61. The plurality of upper sacrificial layers 162 may include a material having an etch selectivity with respect to the plurality of upper insulating layers 161. The plurality of upper sacrificial layers 162 may include substantially the same material as the plurality of lower sacrificial layers 62. For example, the plurality of upper insulating layers 161 may include an oxide, such as silicon oxide, and the plurality of upper sacrificial layers 162 may include a nitride, such as silicon nitride.

A lowermost layer of the preliminary upper stack structure 160T may be a lowermost layer of the plurality of upper insulating layers 161, and an uppermost layer of the preliminary upper stack structure 160T may be an uppermost layer of the plurality of upper insulating layers 161. The lowermost layer of the plurality of upper insulating layers 161 may be in direct contact with the uppermost layer of the plurality of lower insulating layers 61. The interface S1 may be formed between the uppermost layer of the plurality of lower insulating layers 61 and the lowermost layer of the plurality of upper insulating layers 161. Each of the plurality of upper channel holes 171 may have a bottom surface formed at a lower level than the interface S1.

FIGS. 11 and 12 are detailed enlarged partial views of a portion E1 of FIG. 10. Referring to FIG. 11, a center of an upper channel hole 171 may be vertically aligned with a center of a lower channel hole 71. The lower sacrificial buried layer 74 may be exposed at the bottom surface of the upper channel hole 171. The bottom surface of the upper channel hole 171 may be at a lower level than an upper end of the lower sacrificial buried layer 74.

Referring to FIG. 12, the center of the upper channel hole 171 may deviate from the center of the lower channel hole 71. The lower sacrificial buried layer 74, the lower sacrificial liner 73, and the lower blocking layer 72 may be exposed at the bottom surface of the upper channel hole 171.

Figure 14:
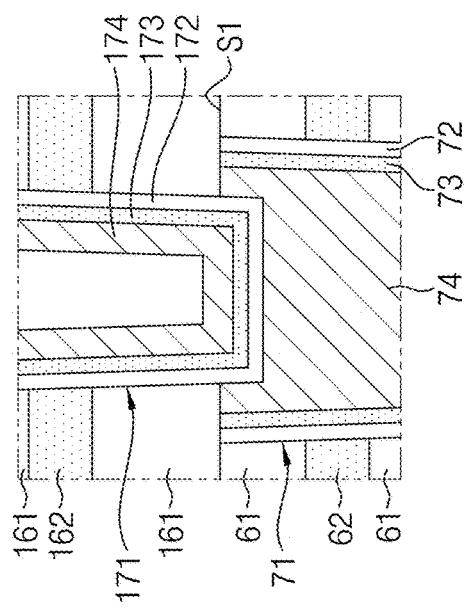
Figure 15:
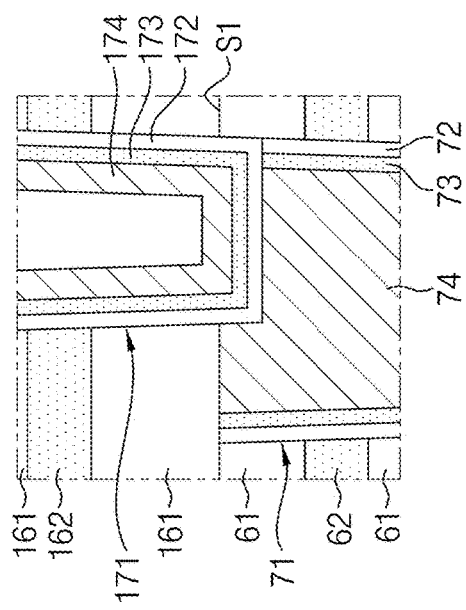
Figure 13:
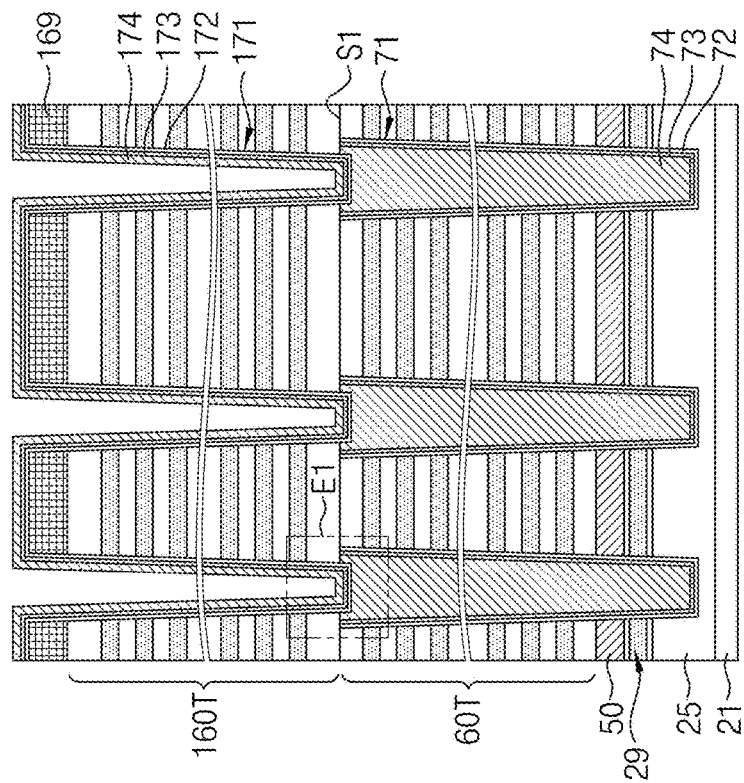

FIGS. 14 and 15 are detailed enlarged partial views of a portion E1 of FIG. 13. Referring to FIGS. 3, 13, and 14, an upper blocking layer 172, an upper sacrificial liner 173, and an upper channel sacrificial layer 174 may be formed inside the plurality of upper channel holes 171. A lower end of the upper blocking layer 172 may be at a lower level than an uppermost end of the lower blocking layer 72.

The upper blocking layer 172 may substantially conformally cover sidewalls and bottom surfaces of the plurality of upper channel holes 171. The upper blocking layer 172 may include silicon oxide, silicon nitride, silicon oxynitride, high-k dielectric material, or a combination thereof. The upper blocking layer 172 may include the same material as the lower blocking layer 72. For example, the lower blocking layer 72 and the upper blocking layer 172 may include silicon oxide.

The upper sacrificial liner 173 may substantially conformally cover a surface of the upper blocking layer 172. The upper sacrificial liner 173 may include a material having an etch selectivity with respect to the upper blocking layer 172 and the upper channel sacrificial layer 174. The upper sacrificial liner 173 may include silicon oxide, silicon nitride, silicon oxynitride, a high-k dielectric material, or a combination thereof. The upper sacrificial liner 173 may include the same material as the lower sacrificial liner 73. For example, the lower sacrificial liner 73 and the upper sacrificial liner 173 may include silicon nitride.

The upper channel sacrificial layer 174 may substantially conformally cover a surface of the upper sacrificial liner 173. The upper channel sacrificial layer 174 may include a material having an etch selectivity with respect to the upper sacrificial liner 173. The upper channel sacrificial layer 174 may include poly-Si, silicon oxide, silicon nitride, silicon oxynitride, or a combination thereof. The upper channel sacrificial layer 174 may include the same material as the lower sacrificial buried layer 74. For example, the lower sacrificial buried layer 74 and the upper channel sacrificial layer 174 may include poly-Si.

Referring to FIG. 15, the upper blocking layer 172 may be in direct contact with the lower blocking layer 72 and the lower sacrificial liner 73.

FIGS. 17 and 18 are detailed enlarged partial views of a portion E1 of FIG. 16. Referring to FIGS. 3, 16, 17, and 18, the lower sacrificial buried layer 74 may be exposed at bottom surfaces of the plurality of upper channel holes 171 using an anisotropic etching process. The upper blocking layer 172 and the upper sacrificial liner 173 may be exposed at sidewalls of the plurality of upper channel holes 171. The upper channel sacrificial layer 174 may remain on the sidewalls of the plurality of upper channel holes 171.

FIGS. 20 and 21 are detailed enlarged partial views of a portion E1 of FIG. 19. Referring to FIGS. 3, 19, 20, and 21, the upper sacrificial liner 173 exposed at the sidewalls of the plurality of upper channel holes 171 may be partially removed using an isotropic etching process to form a plurality of first gap regions 173G. The upper blocking layer 172 may be partially exposed by the plurality of first gap regions 173G. Uppermost ends of the plurality of first gap regions 173G may be at a higher level than the interface S1 between the preliminary lower stack structure 60T and the preliminary upper stack structure 160T.

Figure 22:
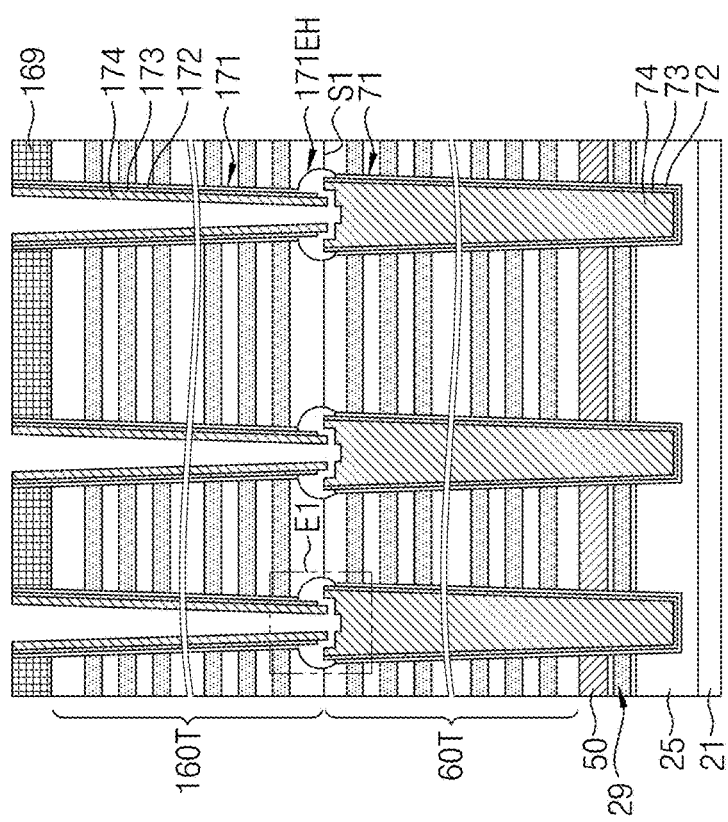

Referring to FIGS. 3 and 22, the upper blocking layer 172 may be partially removed using an isotropic etching process to form a partial extension portion 171EH.

Figure 23:
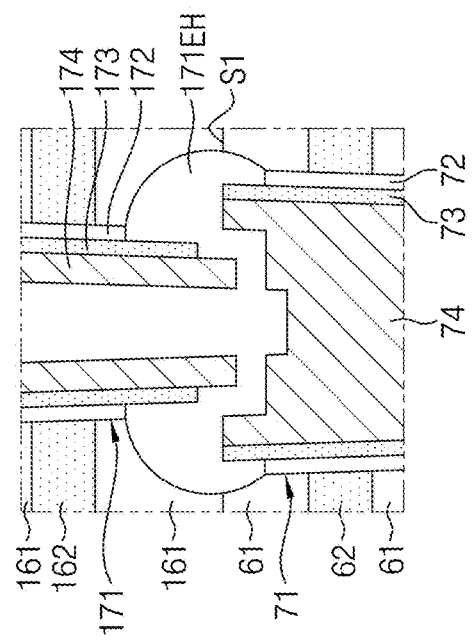
Figure 24:
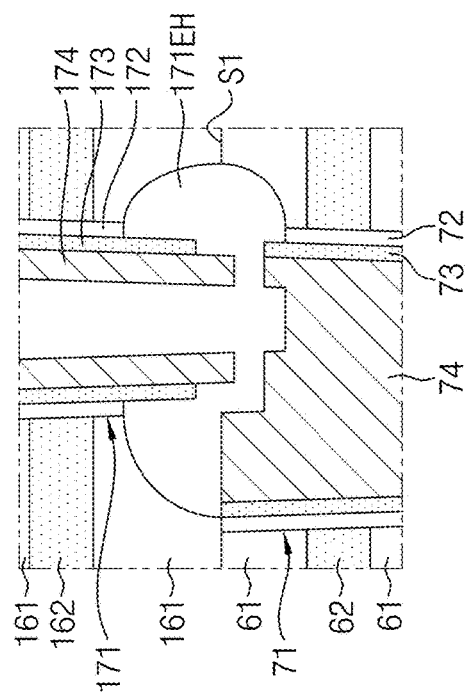

FIGS. 23 and 24 are detailed enlarged partial views of a portion E1 of FIG. 22. Referring to FIG. 23, an uppermost end of the partial extension portion 171EH may be at a higher level than the interface S1 between the preliminary lower stack structure 60T and the preliminary upper stack structure 160T. A lowermost end of the upper blocking layer 172 may remain at a higher level than the interface S1.

During the partial removal of the upper blocking layer 172, a lowermost layer of the plurality of upper insulating layers 161, an uppermost layer of the plurality of lower insulating layers 61, and the lower blocking layer 72 may be partially removed. A lateral width of the partial extension portion 171EH may be greater than a lateral width of the upper channel hole 171 adjacent to the partial extension portion 171EH and may be greater than a lateral width of the lower channel hole 71 adjacent to the partial extension portion 171EH. A lowermost end of the partial extension portion 171EH may be at a lower level than the interface S1. An uppermost end of the lower blocking layer 72 may remain at a lower level than the interface S1.

Referring to FIG. 24, the uppermost end of the lower blocking layer 72 may remain at substantially the same level as the interface S1. A portion of a top surface of the lower blocking layer 72 may be at a lower level than the interface S1.

FIGS. 25 to 27 are enlarged partial views illustrating a method of forming the semiconductor device. Referring to FIG. 25, in an embodiment, a lower sacrificial buried layer 74 may be exposed at a bottom surface of an upper channel hole 171, and a surface oxide layer 1740 may be formed in an upper channel sacrificial layer 174 and the lower sacrificial buried layer 74. The formation of the surface oxide layer 1740 may include a thermal oxidation method, a plasma oxidation method, or a combination thereof.

Referring to FIG. 26, an upper sacrificial liner 173 exposed at a sidewall of the upper channel hole 171 may be partially removed to form a first gap region 173G.

Referring to FIG. 27, an upper blocking layer 172 may be partially removed using an isotropic etching process to form a partial extension portion 171EH. The surface oxide layer 1740 may be removed during the removal of the upper blocking layer 172.

FIGS. 29 and 30 are detailed enlarged partial views of a portion E1 of FIG. 28. Referring to FIGS. 3, 28, 29, and 30, the upper channel sacrificial layer 174 and the lower sacrificial buried layer 74 may be removed using an isotropic etching process.

Figure 31:
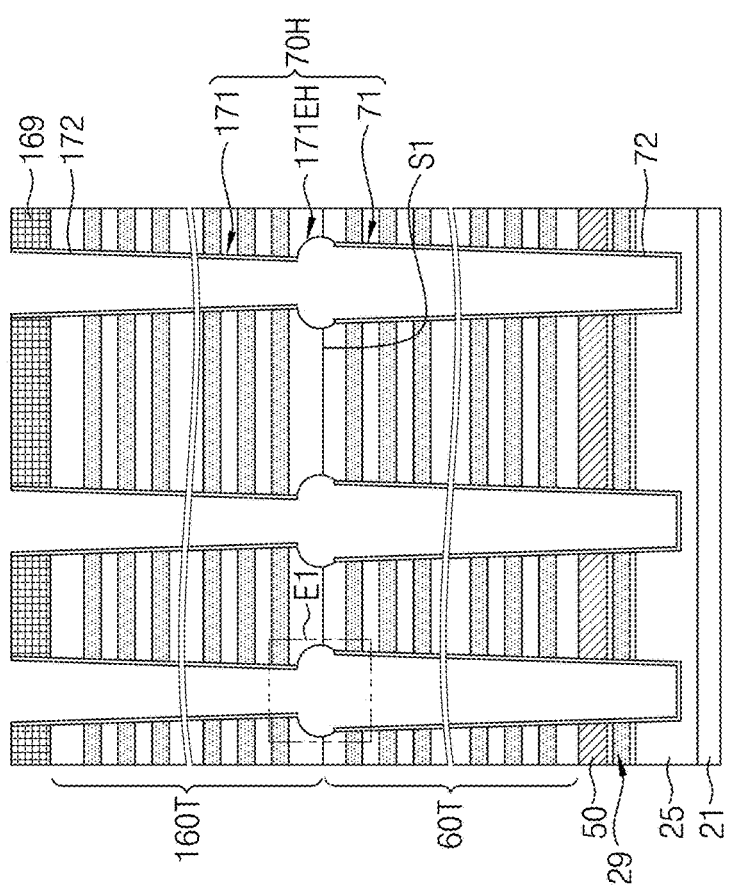

Referring to FIGS. 3 and 31, the upper sacrificial liner 173 and the lower sacrificial liner 73 may be removed using an isotropic etching process. The lower channel hole 71, the partial extension portion 171EH, and the upper channel hole 171 may constitute a channel hole 70H. In an embodiment, after the upper sacrificial liner 173 and the lower sacrificial liner 73 are removed, a recovery process, such as a thermal oxidation process, a plasma oxidation process, a cleaning oxidation process, or a combination thereof, may be performed to recover etching damages of the lower blocking layer 72 and the upper blocking layer 172.

Figure 32:
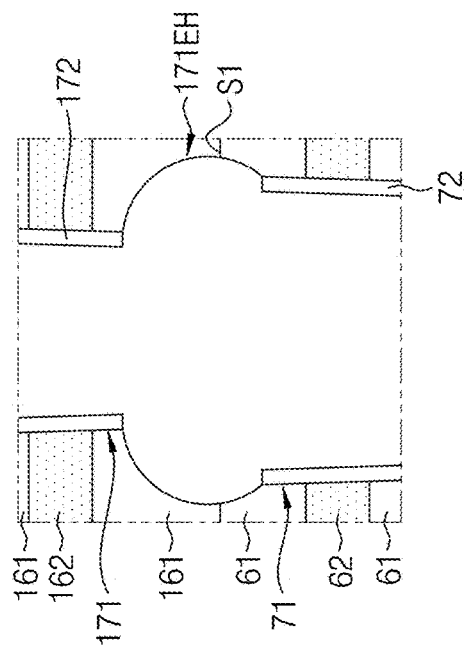
Figure 33:
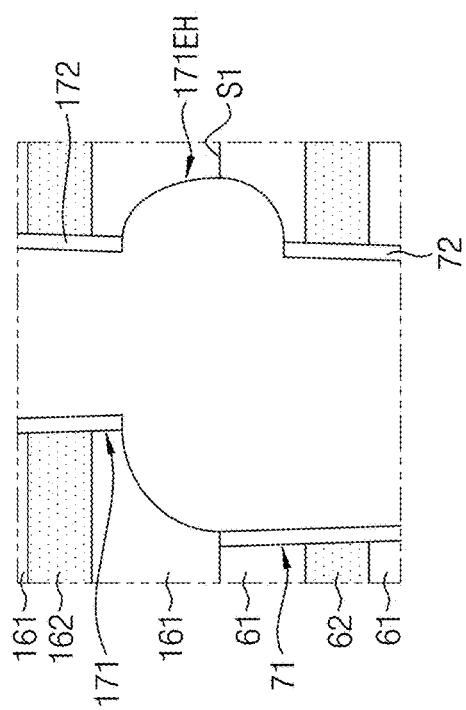

FIGS. 32 and 33 are detailed enlarged partial views of a portion E1 of FIG. 31. Referring to FIG. 32, the partial extension portion 171EH may be formed adjacent to the interface S1. An uppermost layer of the plurality of lower insulating layers 61 and a lowermost layer of the plurality of upper insulating layers 161 may be partially exposed in the partial extension portion 171EH. The partial extension portion 171EH may communicate between the lower channel hole 71 and the upper channel hole 171. The lower blocking layer 72 may remain on a sidewall of the lower channel hole 71. An uppermost end of the lower blocking layer 72 may remain at a lower level than the interface S1. The upper blocking layer 172 may remain on a sidewall of the upper channel hole 171. A lowermost end of the upper blocking layer 172 may remain at a higher level than the interface S1.

Referring to FIG. 33, a center of the upper channel hole 171 may be formed to deviate from a center of the lower channel hole 71. The partial extension portion 171EH may communicate between the lower channel hole 71 and the upper channel hole 171. The uppermost end of the lower blocking layer 72 may remain at substantially the same level as the interface S1. A portion of a top surface of the lower blocking layer 72 may be formed at a lower level than the interface S1.

FIGS. 35 to 38 are detailed enlarged partial views of a portion E1 of FIG. 34. Referring to FIGS. 3, 34, 35, and 36, a charge storage layer 82, a tunnel insulating layer 83, a channel pattern 86, and a core pattern 87 may be formed inside the channel hole 70H using a plurality of thin-film forming processes and a plurality of planarization processes. The mask pattern 169 may be removed. The lower blocking layer 72, the upper blocking layer 172, the charge storage layer 82, and the tunnel insulating layer 83 may constitute an information storage pattern 85.

The core pattern 87 may fill the inside of the channel hole 70H. The channel pattern 86 may surround a bottom surface and side surfaces of the core pattern 87. The tunnel insulating layer 83 may surround a bottom surface and outer side surfaces of the channel pattern 86. The charge storage layer 82 may surround a bottom surface and outer side surfaces of the tunnel insulating layer 83. The charge storage layer 82 may be formed between the lower blocking layer 72 and the tunnel insulating layer 83 and between the upper blocking layer 172 and the tunnel insulating layer 83. In the partial extension portion 171EH, the charge storage layer 82 may be in direct contact with an uppermost layer of the plurality of lower insulating layers 61 and a lowermost layer of the plurality of upper insulating layers 161.

The charge storage layer 82 may include silicon nitride. The tunnel insulating layer 83 may include silicon oxide. The channel pattern 86 may include a semiconductor layer, such as poly-Si. For example, the channel pattern 86 may include a P-type poly-Si layer. The core pattern 87 may include an insulating layer, such as silicon oxide, silicon nitride, silicon oxynitride, or a combination thereof. In an embodiment, the core pattern 87 may be omitted. The channel pattern 86 may fill the insides of the plurality of lower channel holes 71, the partial extension portion 171EH, and the plurality of upper channel holes 171.

Figure 37:
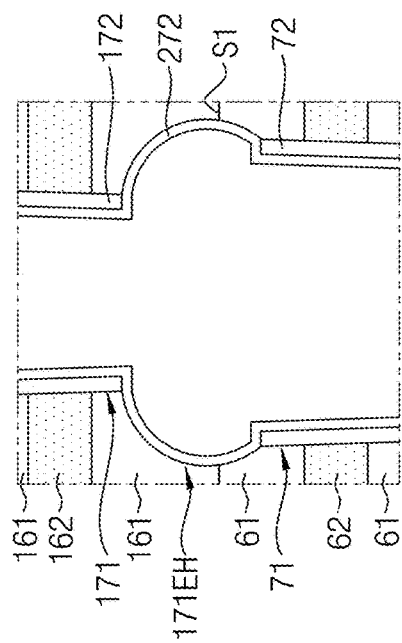

Referring to FIG. 37, in an embodiment, before the charge storage layer 82 is formed, an inner blocking layer 272 may be formed. The inner blocking layer 272 may substantially conformally cover a sidewall and a bottom surface of the channel hole 70H. The inner blocking layer 272 may cover side surfaces of the lower blocking layer 72 and the upper blocking layer 172. In the partial extension portion 171EH, the inner blocking layer 272 may be in direct contact with the uppermost layer of the plurality of lower insulating layers 61 and the lowermost layer of the plurality of upper insulating layers 161. The inner blocking layer 272 may include silicon oxide, silicon nitride, silicon oxynitride, a high-k dielectric material, or a combination thereof. The inner blocking layer 272 may include the same material as the upper blocking layer 172 and the lower blocking layer 72. For example, the inner blocking layer 272, the upper blocking layer 172, and the lower blocking layer 72 may include silicon oxide.

In an embodiment, before the inner blocking layer 272 is formed, the upper blocking layer 172 and the lower blocking layer 72 may be omitted.

Figure 38:
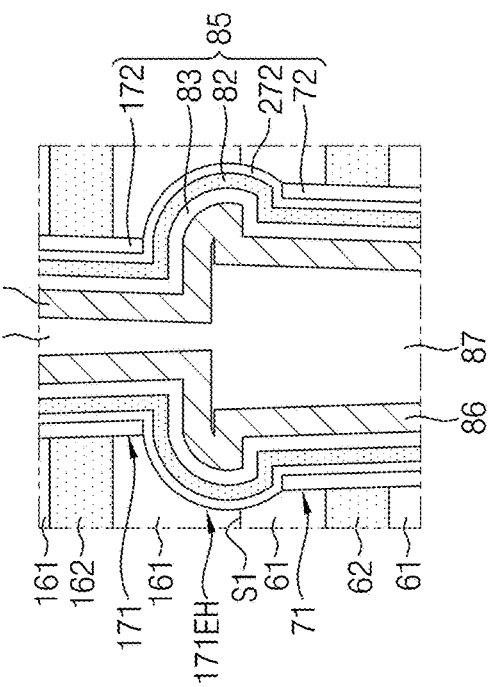

Referring to FIG. 38, a charge storage layer 82, a tunnel insulating layer 83, a channel pattern 86, and a core pattern 87 may be sequentially formed on the inner blocking layer 272. The charge storage layer 82 may substantially conformally cover the inner blocking layer 272. The tunnel insulating layer 83 may substantially conformally cover the charge storage layer 82. The channel pattern 86 may substantially conformally cover the tunnel insulating layer 83.

Referring back to FIGS. 10 to 38, a method of forming a semiconductor device according to an example embodiment may include partially removing the upper blocking layer 172. A lowermost end of the upper blocking layer 172 may be formed at a higher level than the interface S1 between the preliminary lower stack structure 60T and the preliminary upper stack structure 160T. The upper blocking layer 172 may be spaced to be apart from the lower blocking layer 72. During the partial removal of the upper blocking layer 172, a lowermost layer of the plurality of upper insulating layers 161, an uppermost layer of the plurality of lower insulating layers 61, and an upper region of the lower blocking layer 72, which are adjacent to the interface S1, may be partially removed to form the partial extension portion 171EH. A lateral width of the partial extension portion 171EH may be greater than a lateral width of the upper channel hole 171 adjacent to the partial extension portion 171EH. The lateral width of the partial extension portion 171EH may be greater than a lateral width of the lower channel hole 71 adjacent to the partial extension portion 171EH. The partial extension portion 171EH and the upper blocking layer 172 may be advantageous for uniformly and continuously forming the inner blocking layer 272, the charge storage layer 82, the tunnel insulating layer 83, and the channel pattern 86.

Figure 39:
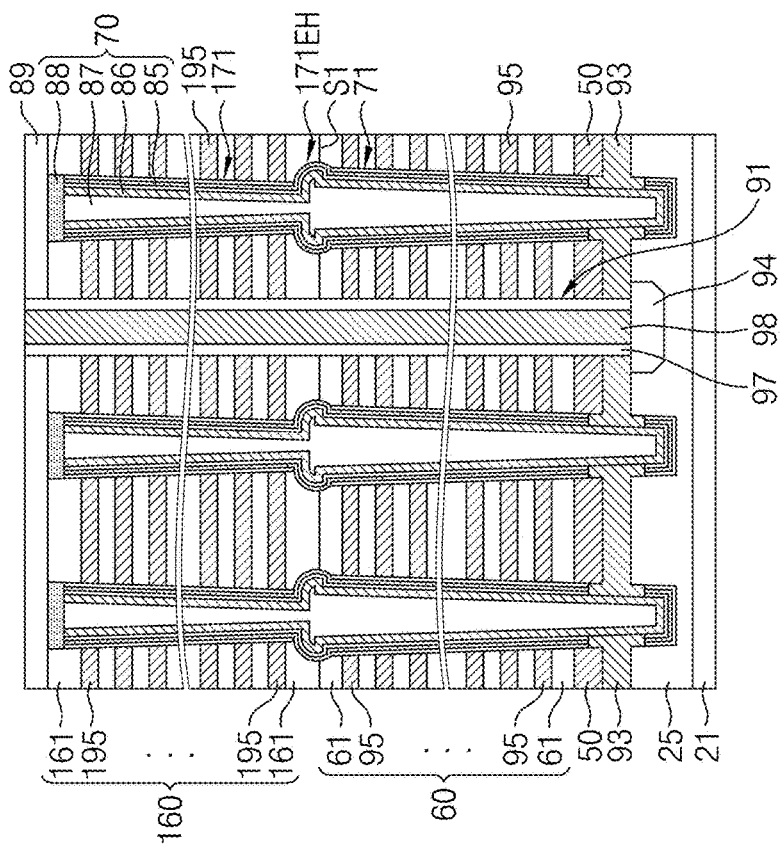

Referring to FIGS. 3 and 39, a plurality of pads 88 may be formed inside the plurality of upper channel holes 171. A first interlayer insulating layer 89 may be formed on the plurality of pads 88 and the preliminary upper stack structure 160T. An isolation trench 91 may be formed through the first interlayer insulating layer 89, the preliminary upper stack structure 160T, the preliminary lower stack structure 60T, the support 50, and the mold layer 29 and expose the buried conductive layer 25. The mold layer 29 may be removed to form a replacement conductive line 93. An impurity region 94 may be formed in the buried conductive layer 25 exposed at a bottom surface of the isolation trench 91. The plurality of lower sacrificial layers 62 and the plurality of upper sacrificial layers 162 may be removed, and a plurality of lower conductive layers 95 and a plurality of upper conductive layers 195 may be formed. Insulating spacers 97 may be formed on sidewalls of the isolation trench 91. A trench buried layer 98 may be formed to fill the inside of the isolation trench 91 and be in contact with the impurity region 94.

Each of the plurality of pads 88 may be in direct contact with the channel pattern 86. The plurality of pads 88 may include a semiconductor layer, such as poly-Si. For example, the plurality of pads 88 may include an N-type poly-Si layer. In an embodiment, each of the plurality of pads 88 may serve as a drain region. In an embodiment, the plurality of pads 88 may include a conductive layer, such as a metal silicide, a metal, a metal nitride, a metal oxide, or a combination thereof. The information storage pattern 85, the channel pattern 86, the core pattern 87, and the pad 88 may constitute a channel structure 70.

The replacement conductive line 93 may be formed through side surfaces of the information storage pattern 85 and may be in contact with the channel pattern 86. The replacement conductive line 93 may be in direct contact with side surfaces of the channel pattern 86. The replacement conductive line 93 may include a conductive material, such as N-type or P-type poly-Si. In an embodiment, the replacement conductive line 93 may include a metal, a metal silicide, a metal nitride, a metal oxide, or a combination thereof. The impurity region 94 may include N-type impurities.

The plurality of lower conductive layers 95 and the plurality of upper conductive layers 195 may include a conductive layer, such as a metal, a metal silicide, a metal nitride, a metal oxide, poly-Si, conductive carbon, or a combination thereof. The plurality of lower insulating layers 61 and the plurality of lower conductive layers 95 that are alternately and repetitively stacked may constitute a lower stack structure 60. The plurality of upper insulating layers 161 and the plurality of upper conductive layers 195 that are alternately and repetitively stacked may constitute an upper stack structure 160. The plurality of lower conductive layers 95 and the plurality of upper conductive layers 195 may include a metal, a metal silicide, a metal nitride, a metal oxide, poly-Si, conductive carbon, or a combination thereof.

The insulating spacers 97 may include silicon oxide, silicon nitride, silicon oxynitride, a low-k dielectric material, a high-k dielectric material, or a combination thereof. The trench buried layer 98 may include a conductive layer, such as a metal, a metal silicide, a metal nitride, a metal oxide, poly-Si, conductive carbon, or a combination thereof. In an embodiment, the trench buried layer 98 may include an insulating layer, such as silicon oxide, silicon nitride, silicon oxynitride, a low-k dielectric material, a high-k dielectric material, or a combination thereof.

Referring back to FIGS. 1 and 3, a second interlayer insulating layer 102 may be formed on the first interlayer insulating layer 89. A plurality of sub-bit plugs 103 may be formed through the second interlayer insulating layer 102 and the first interlayer insulating layer 89 and may be in contact with the plurality of pads 88. A third interlayer insulating layer 104 may be formed on the second interlayer insulating layer 102. A plurality of sub-bit lines 105 may be formed in the third interlayer insulating layer 104 and may be in contact with the plurality of sub-bit plugs 103. A fourth interlayer insulating layer 106 may be formed on the third interlayer insulating layer 104. A bit plug 107 may be formed through the fourth interlayer insulating layer 106 and may be in contact with the plurality of sub-bit lines 105. A bit line 109 may be formed on the fourth interlayer insulating layer 106 and may be in contact with the bit plug 107.

The first interlayer insulating layer 89, the second interlayer insulating layer 102, the third interlayer insulating layer 104, and the fourth interlayer insulating layer 106 may include an insulating layer, such as silicon oxide, silicon nitride, silicon oxynitride, a low-k dielectric material, or a combination thereof. The plurality of sub-bit plugs 103, the plurality of sub-bit lines 105, the plurality of bit plugs 107, and the bit line 109 may include a conductive layer, such as a metal, a metal silicide, a metal nitride, a metal oxide, poly-Si, conductive carbon, or a combination thereof.

According to the example embodiments of the inventive concept, a plurality of channel holes can be formed through a lower stack structure and an upper stack structure. Each of the plurality of channel holes can include a lower channel hole, an upper channel hole, and a partial extension portion configured to communicate between the lower channel hole and the upper channel hole. A channel structure having a channel pattern can be disposed inside the channel hole. The channel pattern can be uniformly and continuously formed due to the partial extension portion. A semiconductor device having excellent electrical properties can be implemented.

While embodiments of inventive concepts have been described with reference to the accompanying drawings, it should be understood by those skilled in the art that various modifications may be made without departing from the scope of inventive concepts and without changing features thereof. Therefore, the above-described embodiments should be considered in a descriptive sense only and not for purposes of limitation.

What is claimed is:

1. A semiconductor device comprising:
   a substrate;
   a lower stack structure on the substrate, the lower stack structure including a plurality of lower insulating layers and a plurality of lower conductive layers that are alternately stacked on the substrate;
   an upper stack structure on the lower stack structure, the upper stack structure including a plurality of upper insulating layers and a plurality of upper conductive layers that are alternately stacked on the lower stack structure,
   the upper stack structure and the lower stack structure defining a channel hole, the channel hole including a lower channel hole defined by the lower stack structure, an upper channel hole defined by the upper stack structure, and a partial extension portion adjacent to an interface between the lower stack structure and the upper stack structure; and
   a channel structure in the channel hole,
   the channel structure including a channel pattern, a tunnel insulating layer on an outside of the channel pattern, a charge storage layer on an outside of the tunnel insulating layer, and a channel insulating layer on an outside of the charge storage layer,
   wherein a lateral width between a straight line passing through a center of the channel hole and an edge of the partial extension portion gradually decreases from a widest portion to an upper portion, the straight line is perpendicular to a surface of the substrate,
   wherein the lateral width between the straight line and the edge of the partial extension portion gradually decreases from the widest portion to a lower portion,
   wherein at least one of the channel pattern and the tunnel insulating layer includes a round shape adjacent to the widest portion,
   wherein the partial extension portion being a portion of the channel hole defined by an uppermost lower insulating layer and a lowermost upper insulating layer among the plurality of lower insulating layers and the plurality of upper insulating layers,
   wherein the lowermost upper insulating layer is directly on the uppermost lower insulating layer,
   wherein the uppermost lower insulating layer includes a silicon nitride layer.

2. The semiconductor device of claim 1, wherein the charge storage layer include the round shape adjacent to the widest portion of the partial extension portion.

3. The semiconductor device of claim 1, wherein a lateral width of the partial extension portion being greater than a lateral width of the upper channel hole at a region adjacent to the partial extension portion, the lateral width of the partial extension portion being greater than a lateral width of the lower channel hole at the region adjacent to the partial extension portion.

4. The semiconductor device of claim 3, wherein the lateral width of the partial extension portion being greater than the lateral width of the upper channel hole at a location extending through a lowermost one of the plurality of upper conductive layers, and
   wherein the lateral width of the partial extension portion being greater than the lateral width of the lower channel hole at a location extending through a uppermost one of the plurality of lower conductive layers.

5. The semiconductor device of claim 1, wherein an uppermost end of the partial extension portion is at a higher level than the interface, and
   wherein a lowermost end of the partial extension portion is at a lower level than the interface.

6. The semiconductor device of claim 1, wherein the channel insulating layer includes
   a lower channel insulating layer between the charge storage layer and the lower stack structure; and
   an upper channel insulating layer between the charge storage layer and the upper stack structure,
   the upper channel insulating layer is spaced to be apart from the lower channel insulating layer.

7. The semiconductor device of claim 6, wherein a lowermost end of the upper channel insulating layer is at a higher level than the interface between the lower stack structure and the upper stack structure.

8. The semiconductor device of claim 6, wherein an uppermost end of the lower channel insulating layer is at a lower level than an interface between the lower stack structure and the upper stack structure.

9. The semiconductor device of claim 6, wherein the charge storage layer in the partial extension portion directly contacts an uppermost lower insulating layer and a lowermost upper insulating layer among the plurality of lower insulating layers and the plurality of upper insulating layers.

10. The semiconductor device of claim 6, wherein the channel insulating layer further comprising:
an inner channel insulating layer surrounding the outside of the charge storage layer, wherein
the inner channel insulating layer is between the charge storage layer and the lower stack structure, and
the inner channel insulating layer is between the charge storage layer and the upper stack structure.

11. The semiconductor device of claim 10, wherein the inner channel insulating layer is between the charge storage layer and the lower channel insulating layer,
wherein the inner channel insulating layer is between the charge storage layer and the upper channel insulating layer, and
wherein the inner channel insulating layer, between the upper channel insulating layer and the lower channel insulating layer, directly contacts an uppermost lower insulating layer and a lowermost upper insulating layer among the plurality of lower insulating layers and the plurality of upper insulating layers.

12. A semiconductor device comprising:
a substrate;
a lower stack structure on the substrate, the lower stack structure including a plurality of lower insulating layers and a plurality of lower conductive layers that are alternately stacked on the substrate;
an upper stack structure on the lower stack structure, the upper stack structure including a plurality of upper insulating layers and a plurality of upper conductive layers that are alternately stacked on the lower stack structure,
the upper stack structure and the lower stack structure defining a channel hole, the channel hole including a lower channel hole defined by the lower stack structure, an upper channel hole defined by the upper stack structure, and a partial extension portion adjacent to an interface between the lower stack structure and the upper stack structure; and
a channel structure in the channel hole, the channel structure including, a channel pattern, a tunnel insulating layer on an outside of the channel pattern, a charge storage layer on an outside of the tunnel insulating layer, and a channel insulating layer on an outside of the charge storage layer,
wherein a lateral width between a straight line passing through a center of the channel hole and an edge of the partial extension portion gradually decreases from a widest portion to an upper portion, the straight line is perpendicular to a surface of the substrate,
wherein the lateral width between the straight line and the edge of the partial extension portion gradually decreases from the widest portion to a lower portion,
wherein at least one of the channel pattern and the tunnel insulating layer includes an arc-shape, an arch-shape, or a C-shape adjacent to the widest portion,
wherein the partial extension portion being a portion of the channel hole defined by an uppermost lower insulating layer and a lowermost upper insulating layer among the plurality of lower insulating layers and the plurality of upper insulating layers,
wherein the lowermost upper insulating layer is directly on the uppermost lower insulating layer,
wherein the uppermost lower insulating layer includes a silicon nitride layer.

13. The semiconductor device of claim 12, wherein the channel insulating layer includes
a lower channel insulating layer between the charge storage layer and the lower stack structure; and
an upper channel insulating layer between the charge storage layer and the upper stack structure,
the upper channel insulating layer is spaced to be apart from the lower channel insulating layer.

14. The semiconductor device of claim 13, wherein a lowermost end of the upper channel insulating layer is at a higher level than the interface between the lower stack structure and the upper stack structure.

15. The semiconductor device of claim 13, wherein an uppermost end of the lower channel insulating layer is at a lower level than an interface between the lower stack structure and the upper stack structure.

16. The semiconductor device of claim 13, wherein the charge storage layer in the partial extension portion directly contacts an uppermost lower insulating layer and a lowermost upper insulating layer among the plurality of lower insulating layers and the plurality of upper insulating layers.

17. The semiconductor device of claim 13, wherein the channel insulating layer further comprising:
an inner channel insulating layer surrounding the outside of the charge storage layer, wherein
the inner channel insulating layer is between the charge storage layer and the lower stack structure, and
the inner channel insulating layer is between the charge storage layer and the upper stack structure.

18. The semiconductor device of claim 17, wherein the inner channel insulating layer is between the charge storage layer and the lower channel insulating layer,
wherein the inner channel insulating layer is between the charge storage layer and the upper channel insulating layer, and
wherein the inner channel insulating layer, between the upper channel insulating layer and the lower channel insulating layer, directly contacts an uppermost lower insulating layer and a lowermost upper insulating layer among the plurality of lower insulating layers and the plurality of upper insulating layers.

* * * * *